(12) United States Patent
Jung et al.

(10) Patent No.: US 9,257,626 B2
(45) Date of Patent: *Feb. 9, 2016

(54) LIGHT EMITTING DEVICE PACKAGE (71) Applicant: LG INNOTEK CO., LTD., Seoul (KR)

(72) Inventors: Su Jung Jung, Seoul (KR); Byung Mok Kim, Seoul (KR); Young Jun Cho, Seoul (KR); Seo Yeon Kwon, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/493,833

(22) Filed: Sep. 23, 2014

(65) Prior Publication Data

US 2015/0069445 A1   Mar. 12, 2015

Related U.S. Application Data

(63) Continuation of application No. 13/595,398, filed on Aug. 27, 2012, now Pat. No. 8,872,414.

(30) Foreign Application Priority Data

Aug. 26, 2011   (KR) .................. 10-2011-0085442

(51) Int. Cl.
*H01L 33/64* (2010.01)
*H01L 33/60* (2010.01)
*H01L 33/48* (2010.01)
*H01L 33/62* (2010.01)
*H01L 25/16* (2006.01)

(52) U.S. Cl.
CPC .............. *H01L 33/64* (2013.01); *H01L 33/483* (2013.01); *H01L 33/486* (2013.01); *H01L 33/60* (2013.01); *H01L 33/62* (2013.01); *H01L 25/167* (2013.01); *H01L 33/642* (2013.01); *H01L 2224/32245* (2013.01); *H01L 2224/48091* (2013.01); *H01L 2224/48227* (2013.01); *H01L 2224/73265* (2013.01)

(58) Field of Classification Search
None
See application file for complete search history.

(56) References Cited

U.S. PATENT DOCUMENTS

| | | | |
|---|---|---|---|
| 6,352,915 B1 | 3/2002 | Cho et al. | 438/613 |
| 8,232,576 B1 | 7/2012 | Lin et al. | 257/99 |
| 2002/0163006 A1 | 11/2002 | Yoganandan et al. | 257/81 |
| 2005/0029535 A1 | 2/2005 | Mazzochette et al. | 257/100 |
| 2006/0267042 A1 | 11/2006 | Izuno et al. | 257/100 |
| 2007/0108460 A1 | 5/2007 | Lee et al. | 257/98 |
| 2009/0053839 A1 | 2/2009 | Kim et al. | 438/26 |
| 2010/0072506 A1* | 3/2010 | Bae et al. | 257/99 |
| 2010/0210049 A1 | 8/2010 | Lin et al. | 438/26 |
| 2011/0037094 A1 | 2/2011 | Lin et al. | 257/99 |
| 2011/0260646 A1* | 10/2011 | Moon et al. | 315/294 |

OTHER PUBLICATIONS

U.S. Office Action dated Mar. 11, 2014 issued in U.S. Appl. No. 13/595,398.
U.S. Notice of Allowance dated Jun. 23, 2014 issued in U.S. Appl. No. 13/595,398.

* cited by examiner

Primary Examiner — Ashok Patel
(74) Attorney, Agent, or Firm — KED & Associates LLP (57) ABSTRACT

A light emitting device package is disclosed. The light emitting device package includes a package body, a heat radiating member disposed in the package body, a light emitting device disposed on the heat radiating member, a bonding member disposed between the light emitting device and the heat radiating member, and a bonding member fixing layer disposed around the bonding member, wherein the bonding member fixing layer has at least one through region.

21 Claims, 9 Drawing Sheets

LIGHT EMITTING DEVICE PACKAGE

CROSS REFERENCE TO RELATED APPLICATIONS

This application is a Continuation application of U.S. patent application Ser. No. 13/595,398, filed Aug. 27, 2012, which claims priority under 35 U.S.C. §119 to Korean Patent Application 10-2011-0085442, filed in Korea on Aug. 26, 2011, which are hereby incorporated in its entirety by reference as if fully set forth herein.

TECHNICAL FIELD

Embodiments relate to a light emitting device package.

BACKGROUND

Light emitting devices, such as light emitting diodes (LEDs) and laser diodes (LDs), which use a Group III-V or Group II-VI compound semiconductor material, may render various colors such as red, green, blue, and ultraviolet by virtue of development of thin film growth technologies and device materials. It may also be possible to produce white light at high efficiency using fluorescent materials or through color mixing.

In a general light emitting device package, a luminous chip is mounted on a connecting electrode disposed in a body. A bonding member such as solder may be used to mount the luminous chip on the connecting electrode. When required to have durability, the body may be made of a High Temperature Co-fired Ceramic (HTCC) material.

Since a bonding process, however, is carried out at high temperature, degradation may be generated at a contact portion between a heat radiating member and solder. It may also be possible to discolor the body in the vicinity of the contact portion due to flux contained in the solder. Bonding force between the light emitting device and the heat radiating member may be decreased due to degradation of the contact portion. Reflectivity may also be reduced by discoloration of the body in the vicinity of the contact portion, thereby deteriorating light extraction efficiency.

SUMMARY

Embodiments provide a light emitting device package capable of having improved heat radiating properties and achieving an enhancement in bonding between a light emitting device and a heat radiating member.

In one embodiment, a light emitting device package includes a package body, a heat radiating member disposed in the package body, a light emitting device disposed on the heat radiating member, a bonding member disposed between the light emitting device and the heat radiating member, and a bonding member fixing layer disposed around the bonding member, wherein the bonding member fixing layer has at least one through region.

The bonding member fixing layer may have a first through region, and the light emitting device may be disposed in the first through region. The package body may have a structure in which a plurality of layers is laminated, and each of the plural layers may be made of at least one of a High Temperature Co-fired Ceramic (HTCC), a low temperature co-fired ceramic (LTCC) or Aluminum Nitride (AlN) material. The bonding member fixing layer may be one of the plural layers.

The package body may have a cavity including at least one of an inclined side surface or a stepped side surface disposed around the light emitting device, and the light emitting device, the bonding member, and the bonding member fixing layer may be disposed in the cavity. The bonding member fixing layer may be placed on side surfaces of the bonding member and light emitting device, and form a bottom of the cavity.

The bonding member may contact with an inner side surface of the first through region. The heat radiating member may include at least one of copper-tungsten (Cu—W), copper (Cu), molybdenum (Mo), and tungsten (W). The bonding member fixing layer may have an upper surface higher than an upper surface of the bonding member and lower than an upper surface of the light emitting device. The bonding member fixing layer may have a roughness at an upper surface thereof. The light emitting device package may further include a reflective material disposed between the light emitting device and the first through region.

The light emitting device package may further include first and second connecting electrodes disposed on at least one of the plural layers, wherein the bonding member fixing layer may have a second through region and a third through region, the first connecting electrode may be disposed in the second through region, and the second connecting electrode may be disposed in the third through region.

An upper surface of the second connecting electrode may have a height equal to or lower than an upper surface of the first connecting electrode. The light emitting device package may further include a Zener diode disposed on the second connecting electrode. The bonding member fixing layer may have a thickness of 5 um to 150 um. The heat radiating member may have an area greater than or equal to an area of the light emitting device.

The light emitting device package may further include an electrode layer disposed under the package body. The heat radiating member may be electrically connected to the electrode layer. The light emitting device may generate light having a wavelength of 260 nm to 395 nm.

In another embodiment, a lighting apparatus includes a light source projecting light, a housing equipped with the light source, a heat radiating unit dissipating heat of the light source, and a holder coupling the light source and the heat radiating unit to the housing, wherein the light source includes a board, and a light emitting device package according to embodiments disposed on the board.

BRIEF DESCRIPTION OF THE DRAWINGS

Arrangements and embodiments may be described in detail with reference to the following drawings in which like reference numerals refer to like elements and wherein.

DESCRIPTION OF SPECIFIC EMBODIMENTS

Hereinafter, embodiments will be described with reference to the annexed drawings.

It will be understood that when a layer (film), region, pattern, or structure is referred to as being 'on' or 'under' another layer (film), region, pad, or pattern of a substrate (board), it can be directly on/under the layer (film), region, pad, or pattern, and one or more intervening layers may also be present. Also, the description relative to 'on' or 'under' of each layer will be given based on the drawings.

In the drawings, the thickness or size of each layer is exaggerated, omitted or schematically illustrated for convenience of description and clarity. Also, the size of each element does not entirely reflect the actual size thereof.

Figure 1:
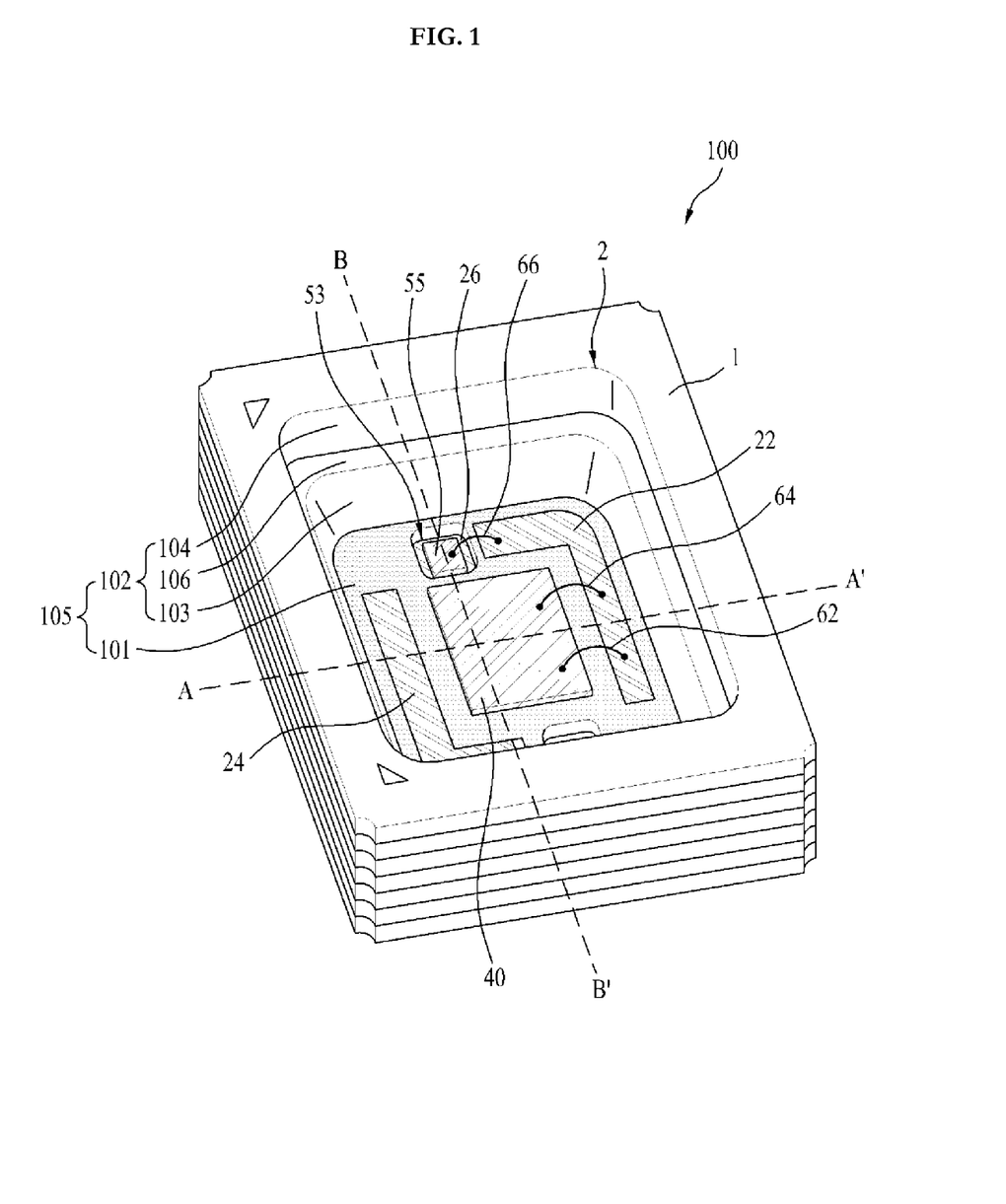
FIG. 1 is a perspective view illustrating a light emitting device package according to an embodiment.
Figure 2:
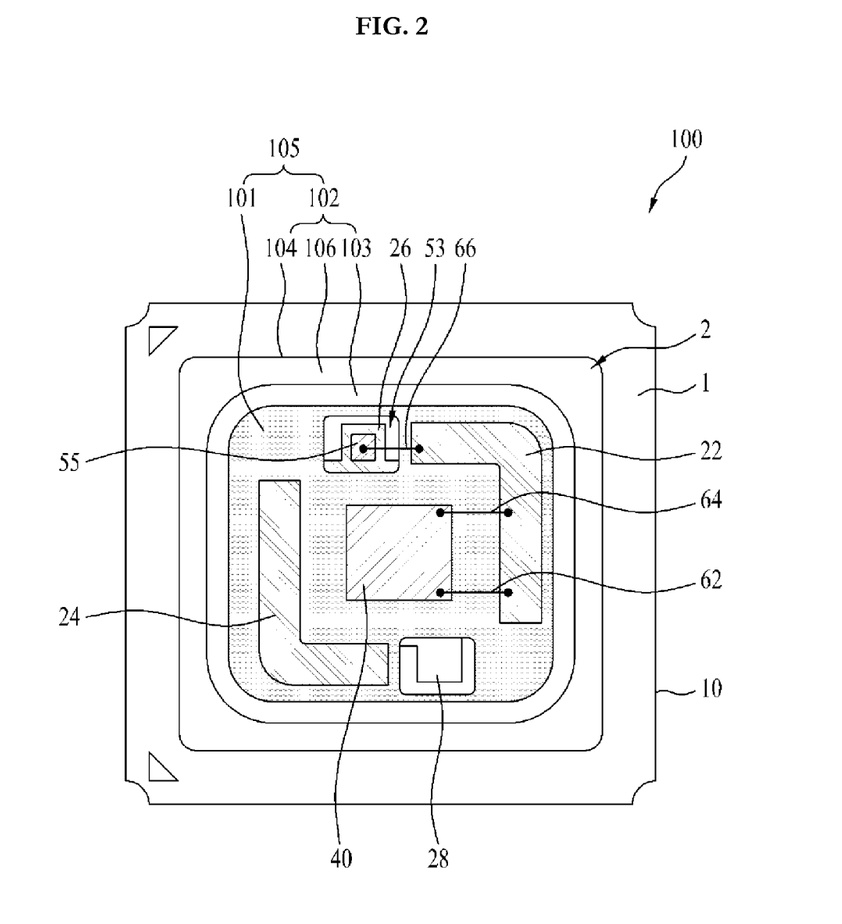
FIG. 2 is a top view illustrating the light emitting device package shown in FIG. 1.
Figure 3:
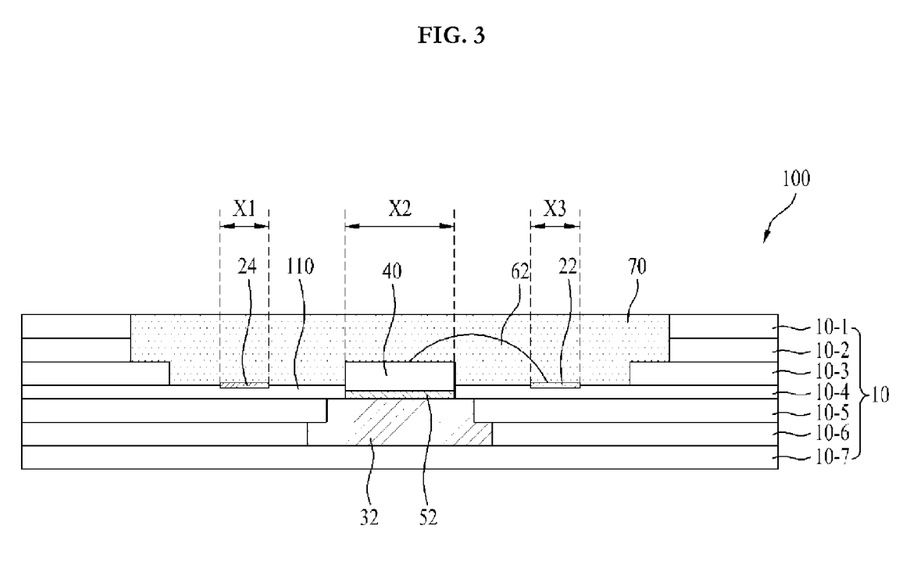
FIG. 3 is a sectional view taken along line A-A' of the light emitting device package shown in FIG. 1.
Figure 4:
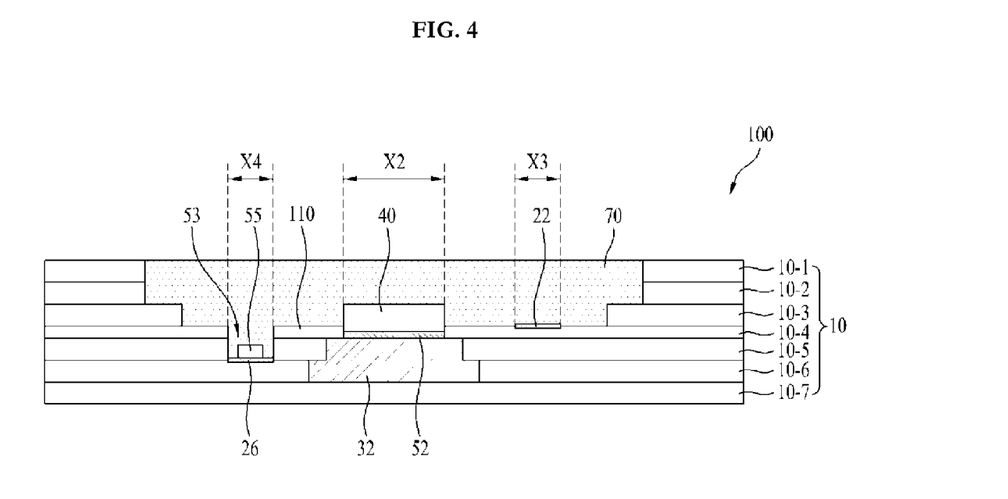
FIG. 4 is a sectional view taken along line B-B' of the light emitting device package 100 shown in FIG. 1.

FIG. 1 is a perspective view illustrating a light emitting device package 100, which is designated by reference numeral 100, according to an embodiment. FIG. 2 is a top view illustrating the light emitting device package 100 shown in FIG. 1. FIG. 3 is a sectional view taken along line A-A' of the light emitting device package 100 shown in FIG. 1. FIG. 4 is a sectional view taken along line B-B' of the light emitting device package 100 shown in FIG. 1.

Referring to FIGS. 1 to 4, the light emitting device package 100 includes a package body 10, first to fourth connecting electrodes 22, 24, 26, and 28, a heat radiating member 32, a light emitting device 40, a bonding member 52, a Zener diode 55, wires 62, 64, and 66, a bonding member fixing layer 110, and a resin layer 70.

The package body 10 may have a structure in which a plurality of layers 10-1 to 10-n (n>1, and n being a natural number) is laminated. For example, the package body 10 may be made of a High Temperature Co-fired Ceramic (HTCC) material, and may have a structure in which the first to n layers 10-1 to 10-n (n>1, and n being a natural number) are laminated. Each of the first to n layers 10-1 to 10-n (n being a natural number, for example, n=7) may be made of a non-conductive material having high thermal conductivity, for example, a ceramic, dielectric, or AlN material. Each of the plural layers 10-1 to 10-n (n>1, and n being a natural number) may have a thickness of 50 um to 300 um.

The package body 10 may be opened at an upper portion thereof, and have a cavity 105 composed of a side surface 102 and a bottom 101. For example, the cavity 105 may be formed by the plural layers 10-1 to 10-n (n>1, and n being a natural number) which constitute the package body 10. The side surface 102 of the cavity 105 may be an inclined surface disposed around the light emitting device 40.

Referring to FIG. 3, the bonding member fixing layer 110 may form the bottom 101 of the cavity 105, whereas the first to third layers 10-1 to 10-3 may form the side surface 102 of the cavity 105.

The cavity 105 may have a cup shape, a concave container shape, or the like. The side surface 102 of the cavity 105 may be inclined relative to the bottom 101 of the cavity 105 or an upper surface 1 of the package body 10. When viewed from the top, the cavity 105 may have a circular, elliptical, or polygonal (for example, square) shape. The cavity 105 may have curved corners 2.

The side surface 102 of the cavity 105 may have a bent flange 106. That is, the side surface 102 of the cavity 105 may include a first side surface 103, a second side surface 104, and a flange 106.

The first side surface 103 may come into contact with the bottom 101 of the cavity 105, and be inclined relative to the bottom 101 of the cavity 105 or the upper surface 1 of the package body 10. On the other hand, the second side surface 104 may come into contact with the upper surface 1 of the package body 10, and be inclined relative to the bottom 101 of the cavity 105 or the upper surface 1 of the package body 10.

The flange 106 may be placed between the first and second side surfaces 103 and 104. A stepped shape may be formed between the flange 106 and the upper surface 1 of the package body 10 or the bottom 101 of the cavity 105, and the flange 106 may be parallel to the upper surface 1 of the package body 10.

When viewed from the top, the package body 10 may have various shapes, such as triangular, square, polygonal, and circular shapes, according to purposes and designs of the light emitting device package 100. For example, the light emitting device package 100 may be utilized in an edge type backlight unit (BLU). When the light emitting device package 100 is also applied to a portable flashlight or a home lighting apparatus, the package body 10 may be modified so as to have a size and a shape capable of being easily equipped with the portable flashlight or the home lighting apparatus.

The first to fourth connecting electrodes 22, 24, 26, and 28 may be disposed on the package body and be spaced apart from one another. The first to fourth connecting electrodes 22, 24, 26, and 28 may be formed as circuit patterns, respectively. For example, the first to fourth connecting electrodes 22, 24, 26, and 28 may be the circuit patterns, which are disposed to be electrically isolated from one another in at least one of the plural layers 10-1 to 10-7, respectively. In other embodiments, the first to fourth connecting electrodes 22, 24, 26, and 28 may be an electrode region for chip mounting or wiring bonding.

The first to fourth connecting electrodes 22, 24, 26, and 28 may be opened toward an inner portion of the cavity 105 from the bonding member fixing layer 110.

The heat radiating member 32 may be electrically spaced apart from or isolated from the first to fourth connecting electrodes 22, 24, 26, and 28, and be disposed beneath the cavity 105 of the package body 10. The heat radiating member 32 may be exposed to the inner portion of the cavity 105 from the bonding member fixing layer 110.

The heat radiating member 32 and the first to fourth connecting electrodes 22, 24, 26, and 28 may be disposed on at least one of the plural layers 10-1 to 10-7, which is placed beneath an upper surface of the light emitting device 40. For example, the light emitting device 40 may be disposed on the fifth layer 10-5, the first and second connecting electrodes 22 and 24 may be disposed on the fourth layer 10-4 placed beneath the upper surface of the light emitting device 40, and the third and fourth connecting electrodes 26 and 28 may be disposed on the sixth layer 10-6 placed beneath the light emitting device 40. The heat radiating member 32 may be disposed in the fifth and sixth layers 10-5 and 10-6 placed beneath the light emitting device 40. The first and second connecting electrodes 22 and 24 may be disposed on the bonding member fixing layer 110.

Each upper surface of the first and second connecting electrodes 22 and 24 and the heat radiating member 32 may be placed to be lower than the upper surface of the light emitting device 40. The upper surfaces of the first and second connecting electrodes 22 and 24 may have the same heights as the upper surface of the heat radiating member 32, whereas the upper surfaces of the third and fourth connecting electrodes 26 and 28 may have heights lower than the upper surface of the heat radiating member 32. Alternatively, the upper surfaces of the first and second connecting electrodes 22 and 24 may have heights equal to or higher than the upper surfaces of the third and fourth connecting electrodes 26 and 28.

The first to fourth connecting electrodes 22 to 28 and at least a portion of the heat radiating member 32 may be exposed to the inner portion of the cavity 105 from at least one layer placed under the light emitting device 40.

For example, the upper surface of the heat radiating member 32 and the first and second connecting electrodes 22 and 24 may be exposed to the inner portion of the cavity 105 from the bonding member fixing layer 110, whereas the third and fourth connecting electrodes 26 and 28 may be exposed to the inner portion of the cavity 105 from the bonding member fixing layer 110 and the fifth layer 10-5. The heat radiating member 32 may have an exposed area greater than or equal to an area of the light emitting device 40.

The heat radiating member 32 may contain at least one of thermally conductive materials, for example, copper-tungsten (Cu—W), copper (Cu), molybdenum (Mo), and tungsten (W). In the illustrated embodiment, the heat radiating member 32 may be made of a thermally conductive material, thereby enhancing heat radiating properties.

The light emitting device 40 is disposed on the heat radiating member 32. The light emitting device 40 may be a vertical type light emitting device, but the disclosure is not limited thereto. For example, the light emitting device 40 may be a horizontal type light emitting device.

Figure 6:
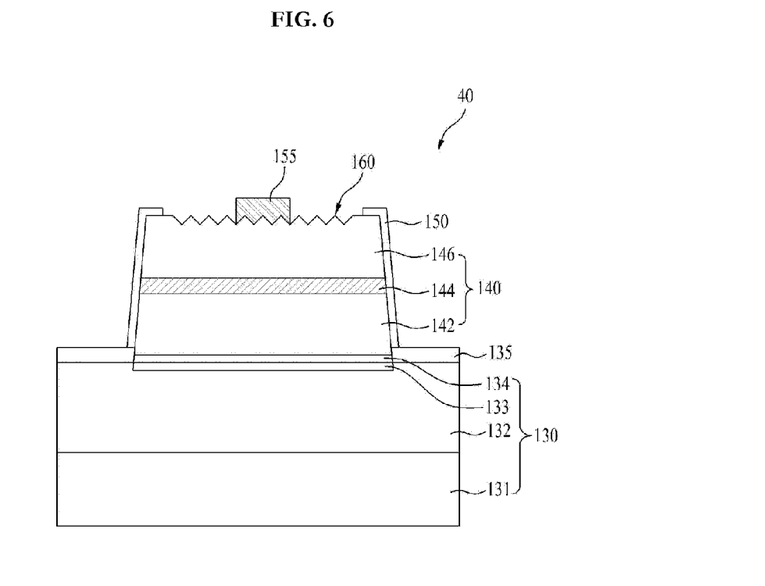
FIG. 6 is a view illustrating one exemplary embodiment of a light emitting device shown in FIG. 1.

FIG. 6 is a view illustrating one exemplary embodiment of the light emitting device 40 shown in FIG. 1. Referring to FIG. 6, the light emitting device 40 includes a second electrode layer 130, a protective payer 135, a light emitting structure 140, which includes a first conductive type semiconductor layer 146, an active layer 144, and a second conductive type semiconductor layer 142, a passivation layer 150, and a first electrode 155.

The second electrode layer 130 may be disposed under the light emitting structure 140, and include a support layer 131, a bonding layer 132, a reflective layer 133, and an ohmic layer 134.

The support layer 131 supports the light emitting structure 140, and supplies power to the light emitting structure 140 together with the first electrode 155.

The bonding layer 132 is disposed on the support layer 131, and allows the reflective layer 133 and the ohmic layer 134 to be bonded to the support layer 131. The reflective layer 133 may be disposed on the bonding layer 132, and reflect light incident from the light emitting structure 140 so as to enhance light extraction efficiency. The ohmic layer 134 may be disposed on the reflective layer 133, and come into ohmic contact with the second conductive type semiconductor layer 142 so as to smoothly supply power.

The protective layer 135 may be disposed on an edge region of the second electrode layer 130, and prevent reliability of the light emitting device 40 from being deteriorated due to peeling-off of an interface between the light emitting structure 140 and the second electrode layer 130.

The second conductive type semiconductor layer 142 may be disposed on the ohmic layer 134, the active layer 144 may be disposed on the second conductive type semiconductor layer 142, and the first conductive type semiconductor layer 146 may be disposed on the active layer 144.

The second conductive type semiconductor layer 142 may be a Group III-V compound semiconductor doped with a second conductive type dopant. The second conductive type semiconductor layer 142 may be made of a semiconductor material having a formula of $In_xAl_yGa_{1-x-y}N$ ($0 \leq x \leq 1$, $0 \leq y \leq 1$, $0x+y \leq 1$). For example, the second conductive type semiconductor layer 142 may be made of a semiconductor material selected from GaN, AlN, AlGaN, InGaN, InN, InAlGaN, AlInN, AlGaAs, Gap, GaAs, GaAsP, AlGaInP, and the like, and be doped with a p-type dopant such as Mg, Zn, Ca, Sr, Ba, or the like.

The first conductive type semiconductor layer 146 may be a Group III-V compound semiconductor doped with a first conductive type dopant. The first conductive type semiconductor layer 146 may be made of a semiconductor material having a formula of $In_xAl_yGa_{1-x-y}N$ ($0 \leq x \leq 1$, $0 \leq y \leq 1$, $0 \leq x+y \leq 1$). For example, the first conductive type semiconductor layer 146 may be made of a semiconductor material selected from GaN, AlN, AlGaN, InGaN, InN, InAlGaN, AlInN, AlGaAs, Gap, GaAs, GaAsP, AlGaInP, and the like, and be doped with an n-type dopant such as Si, Ge, Sn, Se, Te, or the like.

The active layer 144 may create light by energy generated in the course of recombination of electrons and holes provided from the first and second conductive type semiconductor layers 146 and 142. The active layer 144 may have any one of a single quantum well structure, a multi quantum well (MQW) structure, a quantum dot structure, and a quantum wire structure.

When the active layer 144, for example, has the quantum well structure, the active layer 144 may have the single or multi quantum well structure, which includes a well layer having a formula of $In_xAl_yGa_{1-x-y}N$ ($0 \leq x \leq 1$, $0 \leq y \leq 1$, and $0 \leq x+y \leq 1$) and a barrier layer having a formula of $InaAl_bGa_{1-a-b}N$ ($0 \leq a \leq 1$, $0 \leq b \leq 1$, and $0 \leq a+b \leq 1$). The well layer may be made of a material having a band gap smaller than an energy band gap of the barrier layer.

The passivation layer 150 may be disposed on a side surface of the light emitting structure 140 in order to electrically protect the light emitting structure 140, but the disclosure is not limited thereto. The first conductive type semiconductor layer 146 may be formed, at an upper surface thereof, with a roughness 160, in order to enhance light extraction efficiency of the light emitting device 40. The first electrode 155 is disposed on the light emitting structure 140 so as to come into contact with the first conductive type semiconductor layer 146. Although the light emitting device 40 according to the illustrated embodiment may emit light having a wavelength of 260 nm to 395 nm, the disclosure is not limited thereto.

The bonding member 52 is disposed between the light emitting device 40 and the heat radiating member 32, and functions to attach the light emitting device 40 to the heat radiating member 32. The bonding member 52 may be, for example, a solder layer.

The bonding member fixing layer 110 is disposed to enclose a circumference of the bonding member 52, and thus the bonding member 52 is fixed in place. In the illustrated embodiment, the bonding member fixing layer 110 may be any one of the plural layers 10-1 to 10-7. The bonding member fixing layer 110 may be, for example, the fourth layer 10-4. The bonding member fixing layer 110 may have a thickness different from the rest of the plural layers. The bonding member fixing layer 110 may be placed around the bonding member 52, and have at least one of through regions X1 to X4.

The bonding member fixing layer 110 may be disposed in the cavity 105, and be placed on side surfaces of the bonding member 52 and light emitting device 40. The bonding member fixing layer 110 may form the bottom 101 of the cavity 105. The bonding member fixing layer 110, for example, may cover the side surfaces of the bonding member 52 and light emitting device 40. The bonding member fixing layer 110 may be made of the same material as the plural layers 10-1 to 10-7.

When the heat radiating member 32 has the area greater than that of the light emitting device 40, the bonding member fixing layer 110 may cover the remaining portion except for the heat radiating member 32 at which the light emitting device 40 is placed.

The bonding member fixing layer 110 may expose the light emitting device 40, the first to fourth connecting electrodes 22, 24, 26, and 28, and the Zener diode 55 to the inner portion of the cavity 105. Each of the light emitting device 40, the first to fourth connecting electrodes 22, 24, 26, and 28, and the Zener diode 55 may be exposed to the inner portion of the cavity 105 through the associated at least one of the through regions X1 to X4.

For example, the bonding member fixing layer 110 may include a first through region X2 exposing the light emitting device 40, a second through region X3 exposing the first connecting electrode 22, a third through region X1 exposing the second connecting electrode 24, a fourth through region X4 exposing the third connecting electrode 26, and a fifth through region (not shown) exposing the fourth connecting electrode 28. The first through region X2 may contact with a portion of the side surfaces of the bonding member 52 and light emitting device 40 so as to fix the bonding member 52.

The Zener diode 55 may be disposed on the third connecting electrode 26. An upper surface of the third connecting electrode 26 may be placed beneath upper surfaces of the first and second connecting electrodes 22 and 24.

The Zener diode 55 serves to protect the light emitting device package 100 against static electricity. The Zener diode 55 may be disposed in at least one layer, for example, 10-5 of the plural layers 10-1 to 10-7, which is placed beneath the light emitting device 40.

For example, the fourth and fifth layer 10-4 and 10-5 may be formed with a groove 53 exposing the third connecting electrode 26, and the Zener diode 55 may be disposed on the third connecting electrode 26 exposed by the groove 53. That is, the Zener diode 55 may be disposed in the groove 53 formed in the fourth and fifth layer 10-4 and 10-5. The groove 53 may have a depth of 55 um to 450 um.

Since the Zener diode 55 is disposed in the groove 53 formed in the fourth and fifth layer 10-4 and 10-5 placed under the light emitting device 40, it may be possible to prevent light illuminated by the light emitting device 40 from being absorbed in the Zener diode 55, thereby enhancing light extraction efficiency.

The first and second wires 62 and 64 electrically connect the light emitting device 40 to the first connecting electrode 22, whereas the third wire 66 electrically connects the Zener diode 55 to the first connecting electrode 22. As described above, the light emitting device 40, the bonding member 52, and the bonding member fixing layer 110 may be placed in the cavity 105.

The resin layer 70 encloses the light emitting device 40 placed in the cavity 105, to protect the light emitting device 40 from the outside environment (for example, moisture, etc.).

The resin layer 70 may be made of organic matter or inorganic matter. The resin layer 70 may be made of a colorless and transparent polymer resin material, such as epoxy or silicon. The resin layer 70 may contain a phosphor so as to change a wavelength of light emitted from the light emitting device 40.

The illustrated embodiment may be realized as follows, in order to produce white light. For example, the light emitting device 40 may generate blue light, and the resin layer 70 may contain a yellow phosphor, a red phosphor, and a green phosphor. Alternatively, the light emitting device 40 may generate blue light, and the resin layer 70 may contain only a yellow phosphor. Alternatively, the light emitting device 40 may generate blue light, and the resin layer 70 may contain a red phosphor and a green phosphor. Alternatively, the light emitting device 40 may generate ultraviolet (UV) light, and the resin layer 70 may contain a yellow phosphor, a red phosphor, and a green phosphor. In this case, the light emitting device 40 may be utilized in an ultraviolet (UV) lamp capable of also being used for sterilization.

Also, the light emitting device 40 may include a first light emitting device for generation of red light, a second light emitting device for generation of green light, and a third light emitting device for generation of blue light, and the first to third light emitting devices may be disposed in the cavity of the light emitting device package.

The bonding member fixing layer 110 may cover at least the side surface of the bonding member 52.

Figure 5:
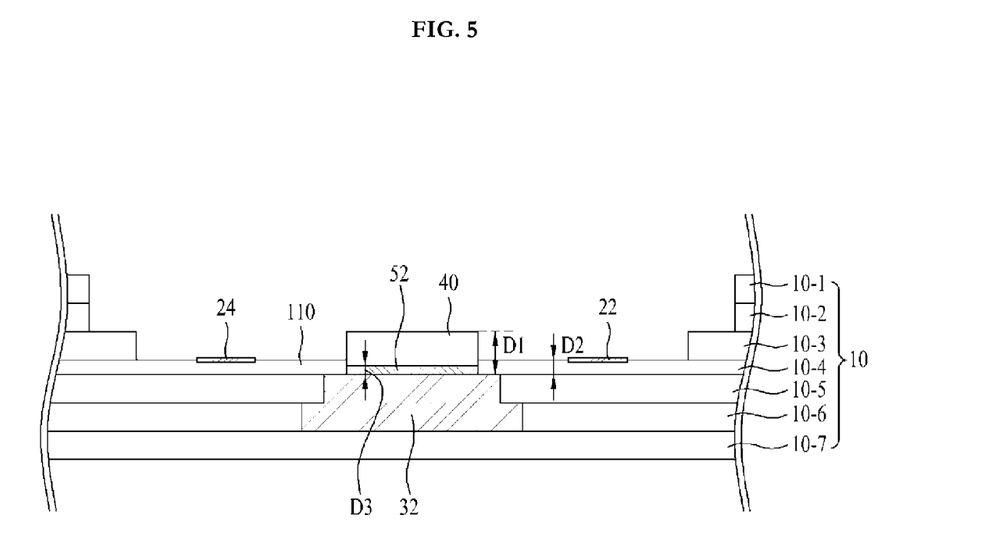
FIG. 5 is an enlarged view illustrating the light emitting device package shown in FIG. 3.

FIG. 5 is an enlarged view illustrating the light emitting device package shown in FIG. 3. Referring to FIG. 5, the bonding member fixing layer 110 may have the upper surface higher than the upper surface of the bonding member 52 and lower than the upper surface of the light emitting device 40.

The bonding member fixing layer 110 may have the thickness D2 greater than the thickness D3 of the bonding member 52 and smaller than the sum D1 of the thickness of the bonding member 52 and the height of the light emitting device 40. For example, the bonding member fixing layer 110 may have the thickness of 5 um to 150 um.

In accordance with the illustrated embodiment, the bonding member fixing layer 110 is provided to cover the circumferences of the bonding member 52 and light emitting device 40, thereby enabling an enhancement in bonding between the light emitting device 40 and the heat radiating member 32.

Figure 7:
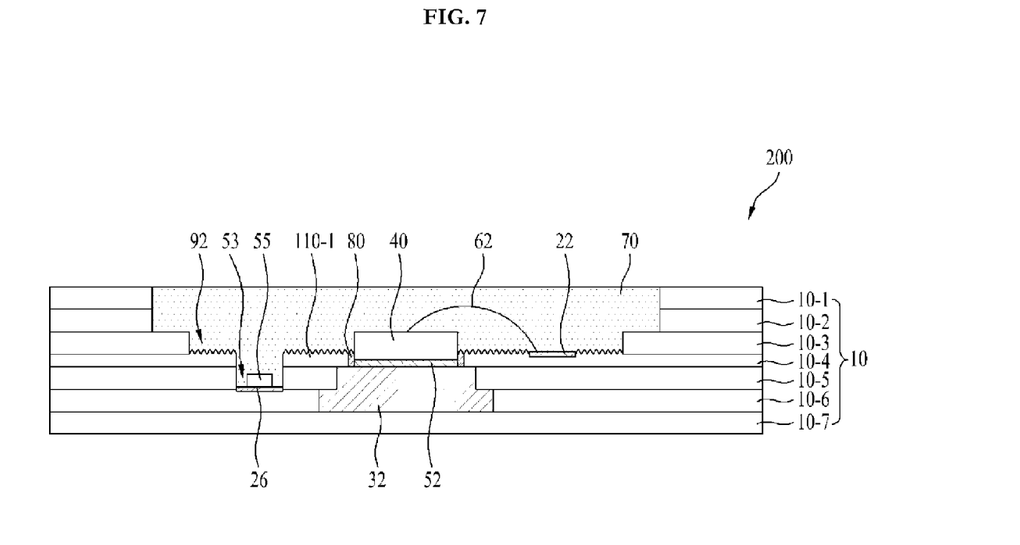
FIG. 7 is a sectional view illustrating a light emitting device package according to another embodiment.

FIG. 7 is a sectional view illustrating a light emitting device package, which is designated by reference numeral 200, according to another embodiment. A perspective view and a top view of the light emitting device package 200 may be referred to FIGS. 1 to 2. The components, which are similar to those of the embodiment illustrated in FIGS. 1 to 3, will be designated by like reference numerals and, as such, no description thereof will be given.

Referring to FIG. 7, the light emitting device package 200 includes a package body 10, first to fourth connecting electrodes 22, 24, 26, and 28, a heat radiating member 32, a light emitting device 40, a bonding member 52, a Zener diode 55, wires 62, 64, and 66, a bonding member fixing layer 110-1, a reflective material 80, and a resin layer 70.

The bonding member fixing layer 110-1 may have a roughness 92 at an upper surface thereof. This may achieve an enhancement in light extraction efficiency of the light emitting device package 200. The roughness 92 may be a regular or irregular convex/concave shape.

The reflective material 80 may be disposed between the bonding member fixing layer 110-1 and the light emitting device 40 and between the bonding member fixing layer 110-1 and the bonding member 52. That is, the reflective material 80 may be disposed between the light emitting device 40 and a first through region X2 of the bonding member fixing layer 110-1. The reflective material 80 may reflect light re-incident upon the light emitting device 40, such that it may be possible to prevent light from being absorbed in the light emitting device 40, thereby enabling an enhancement in light extraction efficiency. The reflective material 80 may be made of polyethylene terephthalate (PET) resin, $TiO_2$, or Ag, or may be a reflective sheet or the like.

Figure 8:
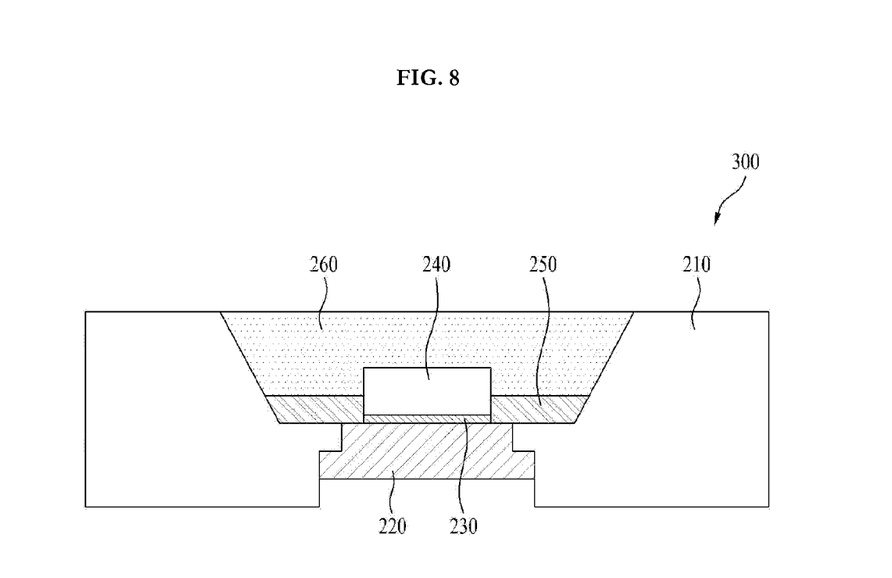
FIG. 8 is a sectional view illustrating a light emitting device package according to a further embodiment.

FIG. 8 is a sectional view illustrating a light emitting device package, which is designated by reference numeral 300, according to a further embodiment. Referring to FIG. 8, the light emitting device package 300 includes a package body 210, a heat radiating member 220, a light emitting device 240, a bonding member 230, a bonding member fixing layer 250, and a resin layer 260.

Unlike the embodiment illustrated in FIG. 1, the package body 210 may be comprised of one integrated layer, instead of a plurality of layers. The package body 210 may be made of a silicon material, a synthetic resin material, or a metal material. The package body 210 may have a cavity including a bottom, at which the light emitting device 240 is disposed, and an inclined side surface disposed around the light emitting device 240.

The heat radiating member 220 may have a first region exposed from the bottom of the cavity, and the light emitting device 240 may be disposed on the first region. The bonding member 230 is disposed between the light emitting device 240 and the first region of the heat radiating member 220 in order to attach the light emitting device 240 to the first region of the heat radiating member 220. A second region of the heat radiating member 220 may be exposed from a back surface of the package body 210 in order to enhance heat radiating efficiency.

The bonding member fixing layer 250 is disposed to enclose a circumference of the bonding member 230, and thus the bonding member 230 is fixed in place. The bonding member fixing layer 250 may cover the bottom of the cavity, and cover side surfaces of the bonding member 230 and light emitting device 240. The cavity may be filled with the resin layer 260, to surround the light emitting device 240.

Figure 9:
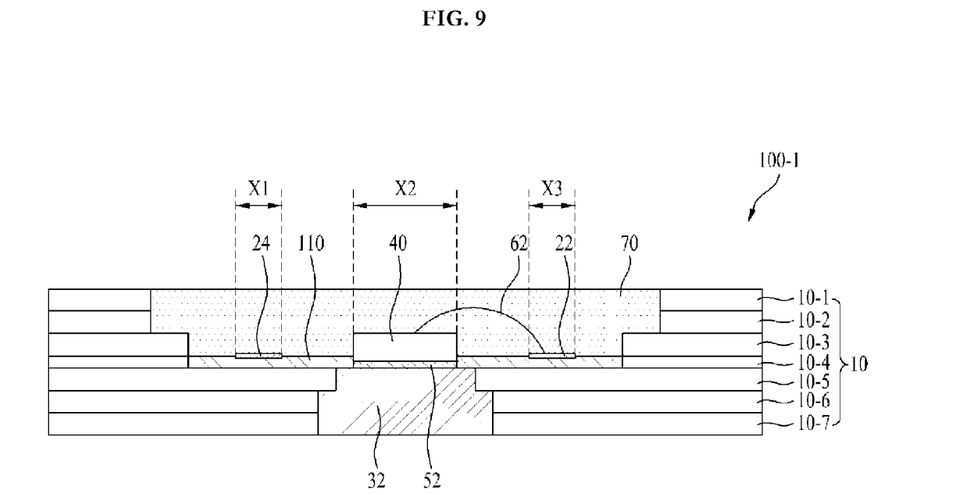
FIG. 9 is a sectional view illustrating a light emitting device package according to still another embodiment.

FIG. 9 is a sectional view illustrating a light emitting device package, which is designated by reference numeral 100-1, according to still another embodiment. A perspective view and a top view of the light emitting device package 100-1 may be referred to FIGS. 1 to 2. The components, which are similar to those of the embodiment illustrated in FIGS. 1 to 3, will be designated by like reference numerals and, as such, no description thereof will be given.

The embodiment illustrated in FIG. 9 refers to a modified example of the light emitting device package illustrated in FIG. 1. In order to enhance light emitting efficiency in the present embodiment, a heat radiating member 32 may be exposed to a back surface of a package body 10. For example, the heat radiating member 32 may be exposed from a seventh layer 10-7 to the outside. A bonding member fixing layer 110 may be made of a material different from the plural layers (for example, 10-1 to 10-7).

Figure 10:
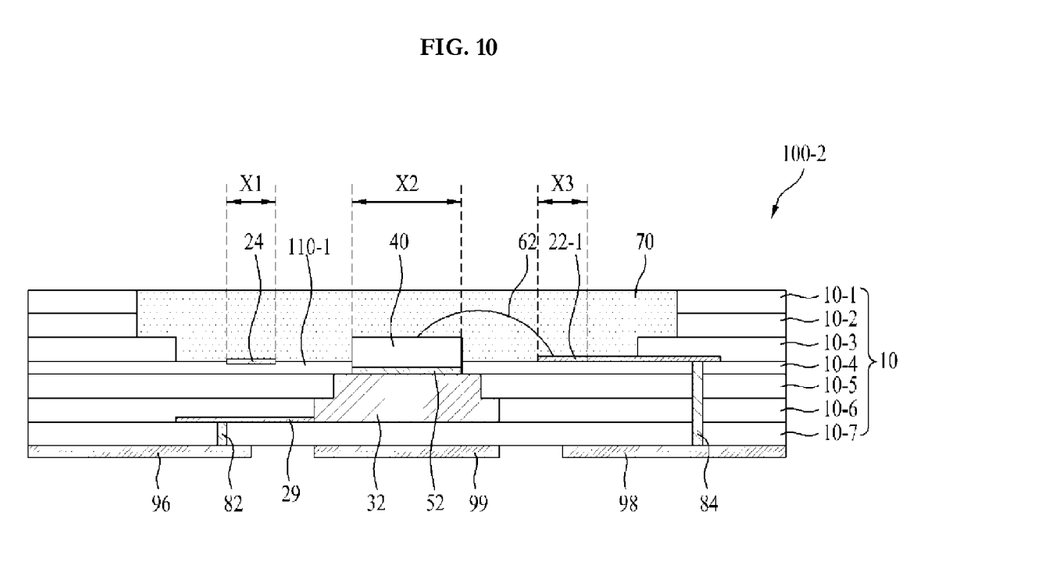
FIG. 10 is a sectional view illustrating a light emitting device package according to yet another embodiment.

FIG. 10 is a sectional view illustrating a light emitting device package, which is designated by reference numeral 100-2, according to yet another embodiment. A perspective view and a top view of the light emitting device package 100-2 may be referred to FIGS. 1 to 2. The components, which are similar to those of the embodiment illustrated in FIGS. 1 to 3, will be designated by like reference numerals and, as such, no description thereof will be given.

The light emitting device package 100-2 may include a package body 10, connecting electrodes 22-1, 24, 26, 28, and 29, a heat radiating member 32, a light emitting device 40, a bonding member 52, a Zener diode 55, wires 62, 64, and 66, a bonding member fixing layer 110-1, a first electrode layer 96, a second electrode layer 98, a dummy electrode 99, via contacts 82 and 84, and a resin layer 70.

The bonding member fixing layer 110-1 may be made of the same material, for example, a High Temperature Co-fired Ceramic (HTCC) material as the plural layers (for example, 10-1 to 10-7). The bonding member fixing layer 110-1, for example, may be made of the same material as a fourth layer 10-4, and may be integrated with the fourth layer 10-4. The bonding member fixing layer 110-1 may be similar to that described in FIG. 1.

The first electrode layer 96, the second electrode layer 98, and dummy electrode 99 may be disposed under the package body 10. For example, the first electrode layer 96, the second electrode layer 98, and the dummy electrode 99 may be disposed under the lowermost layer 10-7 of the plural layers 10-1 to 10-7 and be spaced apart from one another.

The first electrode layer 96 may be electrically connected to the heat radiating member 32. The second electrode layer 98 may be electrically connected to any one of the connecting electrodes 22-1, 24, 26, 28, and 29. The dummy electrode 99 may be disposed to be spaced apart from the first and second electrode layers 96 and 98.

A first connecting electrode 22-1 may be similar to that described illustrated in FIG. 1, except for further extending to one side of the package body 10. A fifth connecting electrode 29 may be disposed on any one layer (for example, 10-7) of the plural layers 10-1 to 10-7, which is placed beneath the light emitting device 40, and be electrically connected to the heat radiating member 32. For example fifth connecting electrode 29 may be directly connected to the heat radiating member 32 in FIG. 10, or may be connected to the heat radiating member 32 by via contact (not shown) in another embodiment.

The via contacts 82 and 84 may pass through at least one of the plural layers 10-1 to 10-7. Each of the via contacts 82 and 84 may connect any one of the connecting electrodes 22-1, 24, 26, 28, and 29 to any one of the first and second electrode layers 96 and 98.

For example, a first via contact 82 may pass through a seventh layer 10-7, and the first electrode layer 96 may be electrically connected to the fifth connecting electrode 29 through the first via contact 82. On the other hand, a second via contact 84 may pass through the fourth to seventh layers 10-4 to 10-7, and the second electrode layer 98 may be electrically connected to the first connecting electrode 22-1 through the second via contact 84.

Figure 11:
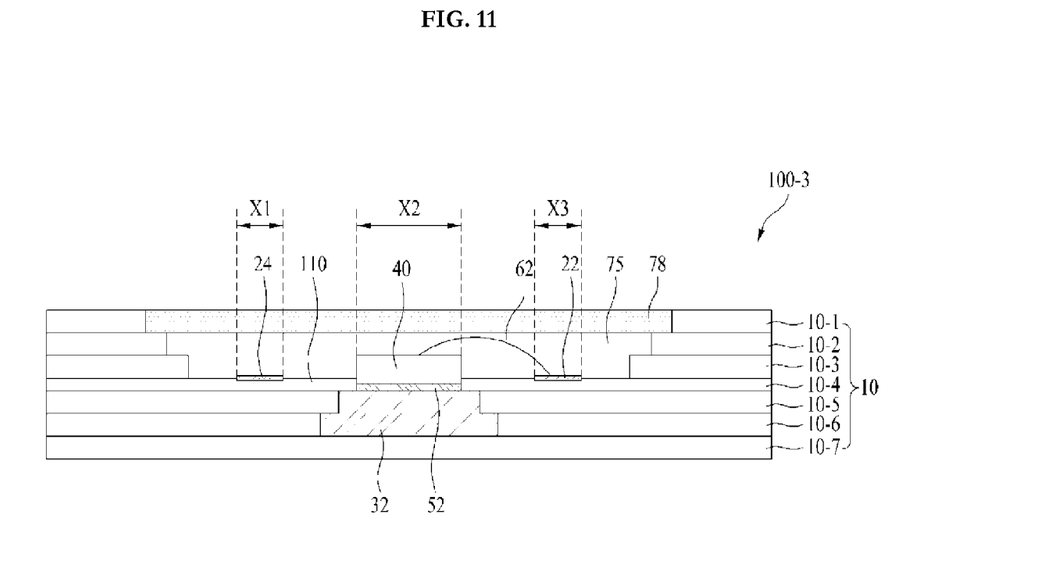
FIG. 11 is a sectional view illustrating a light emitting device package according to another embodiment.

FIG. 11 is a sectional view illustrating a light emitting device package, which is designated by reference numeral 100-3. A perspective view and a top view of the light emitting device package 100-3 may be referred to FIGS. 1 to 2. The components, which are similar to those of the embodiment illustrated in FIGS. 1 to 3, will be designated by like reference numerals and, as such, no description thereof will be given.

The light emitting device package 100-3 may include a package body 10, first to fourth connecting electrodes 22, 24, 26, and 28, a heat radiating member 32, a light emitting device 40, a bonding member 52, a Zener diode 55, wires 62, 64, and 66, a bonding member fixing layer 110, and a glass layer 78.

Referring to FIG. 11, a glass layer 78 may substitute for the resin layer 70 in FIG. 3. The glass layer 78 may dispose on the one 10-2 of the plurality of layers 10-1 to 10-n to cover the cavity 105. More specifically, an edge area of the top surface of the one layer 10-2 in the cavity 105 may be exposed by the uppermost layer 10-1 and the glass layer 78 may be disposed on the exposed edge area of the top surface of the one layer 10-2.

In another embodiment, the glass layer 78 may be disposed over the cavity 105. For example, the glass layer 78 may be disposed on a top surface of the uppermost layer 10-1.

The glass layer 78 may be positioned on the light emitting device 40 and wires 62, 64, and 66. The space 75 in the cavity 105 below the glass layer 78 is empty and air void. The glass layer 78 may contain a phosphor so as to change a wavelength of light emitted from the light emitting device 40.

Figure 12:
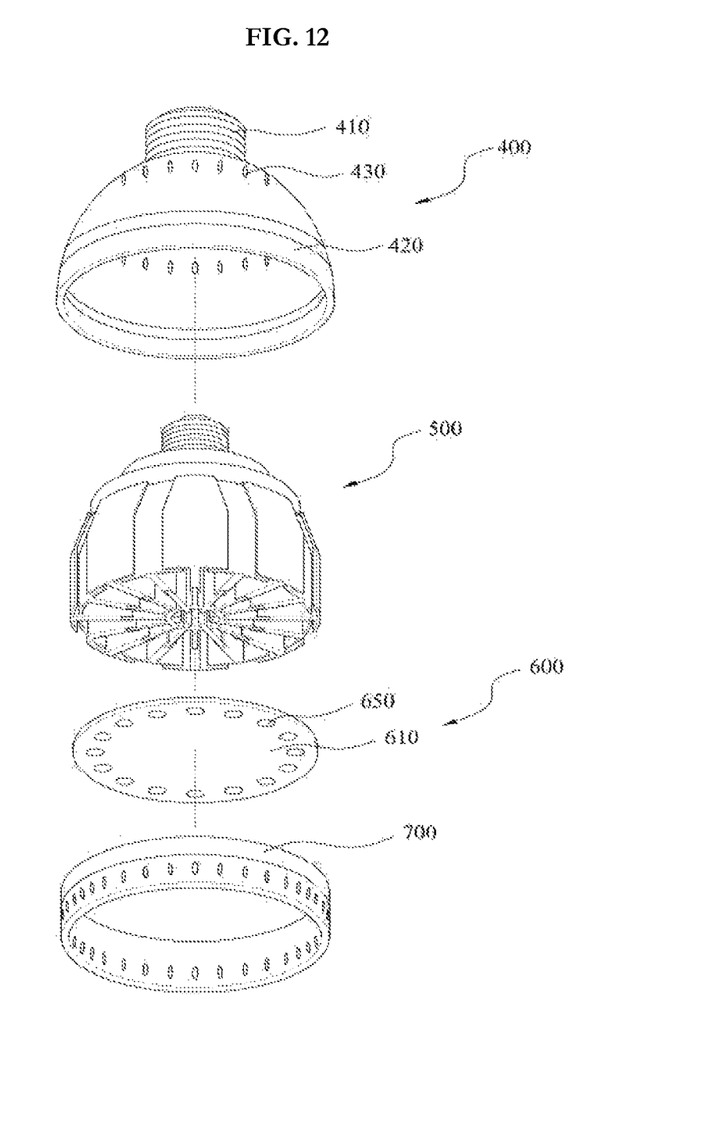
FIG. 12 is an exploded perspective view illustrating a lighting apparatus including a light emitting device package according to an exemplary embodiment.

FIG. 12 is an exploded perspective view illustrating a lighting apparatus including a light emitting device package according to an exemplary embodiment. Referring to FIG. 12, the lighting apparatus includes a light source 600 for projecting light, a housing 400 equipped with the light source 600, a heat radiating unit 500 for dissipating heat generated from the light source 600, and a holder 700 for coupling the light source 600 and heat radiating unit 500 to the housing 400.

The housing 400 includes a socket connection part 410 connected to an electric socket (not shown), and a body part 420, which is connected to the socket connection part 410 and is equipped with the light source 600. At least one air hole 430 may be formed through the body part 420.

Although a plurality of air holes 430 are formed through the body part 420 of the housing 400 in the illustrated embodiment, a single air hole 430 may be formed through the body part 420. Although the plural air holes 430 are radially disposed, various arrangements thereof may be possible.

The light source 600 may be a light emitting module, which includes a board 610 and a plurality of light emitting device packages 650 mounted on the board 610. Each light emitting device package 650 may have any one of the above-mentioned configurations. Here, the board 610 may be shaped to be fitted in an opening formed at the housing 400. Also, the board 610 may be made of a material having high thermal conductivity so as to transfer heat to the heat radiating unit 500, as will be described below.

The holder 700 is provided under the light source 600. The holder 700 may include a frame and other air holes. Although not shown, an optical member may be provided under the light source 600 so as to diffuse, scatter or converge light projected from the light emitting module 600.

A lighting apparatus according to another exemplary embodiment may be an ultraviolet (UV) lamp capable of also being used for sterilization. In this case, a light source of the UV lamp may be a light source for generation of ultraviolet (UV) light.

Figure 13:
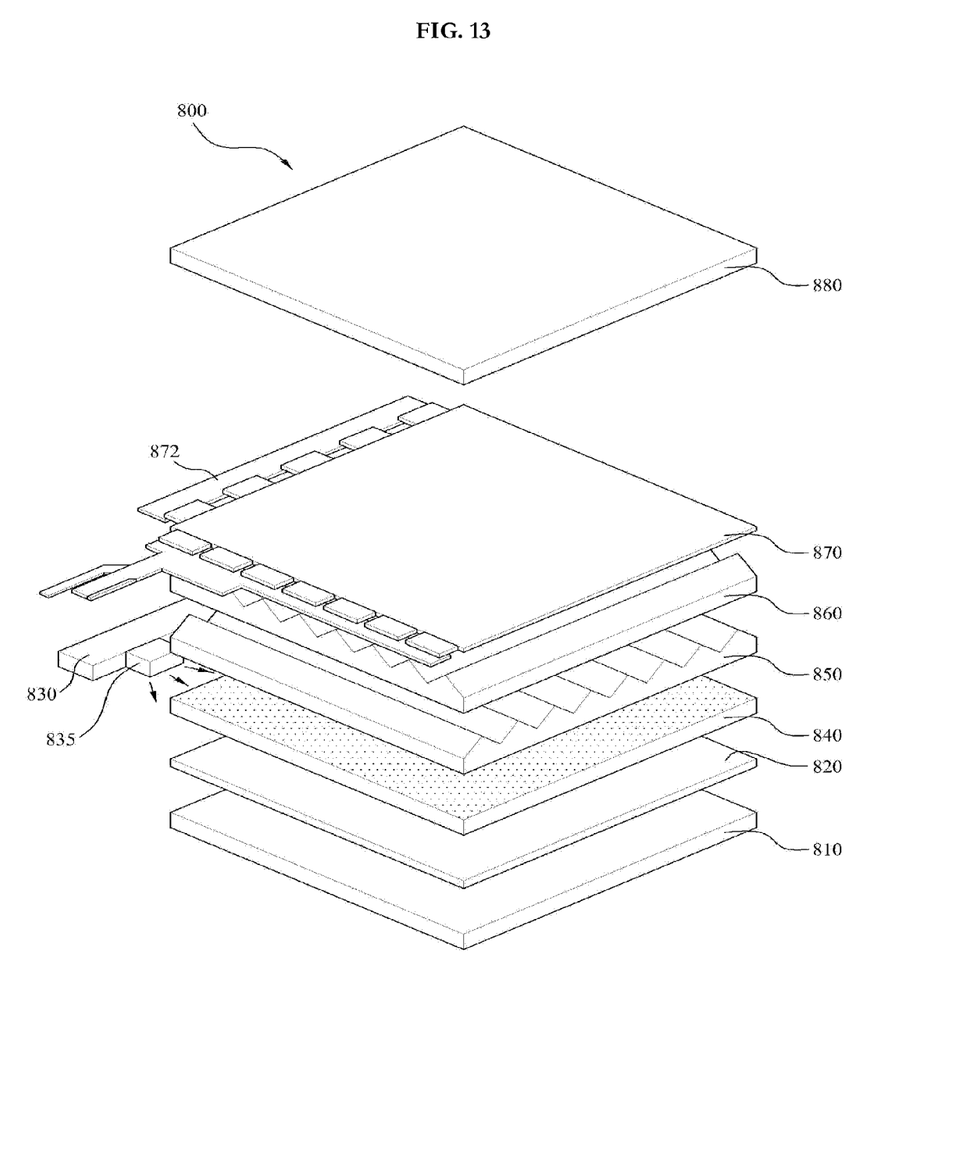
FIG. 13 is an exploded perspective view illustrating a display apparatus including a light emitting device package according to an exemplary embodiment.

FIG. 13 is an exploded perspective view illustrating a display apparatus including a light emitting device package according to an exemplary embodiment. Referring to FIG. 13, the display apparatus, which is designated by reference numeral 800, may include a bottom cover 810, a reflective plate 820 disposed on the bottom cover 810, light emitting modules 830 and 835 for emitting light, a light guide plate 840 disposed in front of the reflective plate 820 so as to guide light emitted from the light emitting modules 830 and 835 to a front side of the display apparatus 800, an optical sheet which includes prism sheets 850 and 860 disposed in front of the light guide plate 840, a display panel 870 disposed in front of the optical sheet, an image signal output circuit 872 connected to the display panel 870 to supply an image signal to the display panel 870, and a color filter 880 disposed in front of the display panel 870. Here, the bottom cover 810, the reflective plate 820, the light emitting modules 830 and 835, the light guide plate 840, and the optical sheet may form a backlight unit.

The light emitting modules may be comprised of a board 830 and light emitting device packages 835 mounted on the board 830. Here, a printed circuit board (PCB) may be used as the board 830. Each light emitting device package 835 may have any one of the above-mentioned configurations.

The bottom cover 810 may serve to receive the components of the display apparatus 800. The reflective plate 820 may be provided as a separate component, as shown in FIG. 12, or may be provided to be coated over a rear surface of the light guide plate 840 or a front surface of the bottom cover 810 using a material having high reflectivity.

Here, the reflective plate 820 may be made of a material having high reflectivity and capable of being formed into an ultra thin structure. Polyethylene terephthalate (PET) may be used for the reflective plate 820.

The light guide plate 840 may be made of a material such as polymethylmethacrylate (PMMA), polycarbonate (PC), or polyethylene (PE).

A first prism sheet 850 may be formed using a polymer exhibiting light transmittance and elasticity on one surface of a base film. The first prism sheet 850 may have a prism layer having a plurality of three-dimensional structures in the form of a repeated pattern. Here, the pattern may be of a stripe type in which ridges and valleys are repeated.

A second prism sheet 860 may be configured such that the orientation direction of ridges and valleys formed on one surface of the base film of the second prism sheet 860 is perpendicular to the orientation direction of the ridges and valleys formed on one surface of the base film of the first prism sheet 850. Such a configuration serves to uniformly distribute light transmitted from the light modules and the reflective sheet toward the entire surface of the display panel 870.

Although not shown, a diffusion sheet may be disposed between the light guide plate 840 and the first prism sheet 850. The diffusion sheet may be made of a polyester or polycarbonate-based material. The diffusion sheet may expand a light projecting angle to the maximum extent possible through refraction and scattering of light incident from the backlight unit. The diffusion sheet may include a support layer containing light diffusion agents, and first and second layers, which are formed at a light exit surface (the direction of the first prism sheet) and a light incident surface (the direction of the reflective sheet) and does not contain light diffusion agents.

In the illustrated embodiment, the optical sheet may be comprised of the first prism sheet 850 and second prism sheet 860. However, the optical sheet may be comprised of other combinations, for example, a microlens array, a combination of the diffusion sheet and the microlens array, and a combination of one prism sheet and the microlens array.

A liquid crystal display panel may be used as the display panel 870. Furthermore, instead of the liquid crystal display panel 870, other kinds of display devices requiring light sources may be provided.

As is apparent from the above description, a light emitting device package may have improved heat radiating properties and achieve an enhancement in bonding between a light emitting device and a heat radiating member.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device package comprising:
   a package body having a cavity composed of a side surface and a bottom, wherein the package body has a structure in which a plurality of layers is laminated and the cavity is formed by the plurality of layers;
   a heat radiating member disposed under the cavity of the package body;
   a light emitting device disposed on the heat radiating member;
   a bonding member disposed between the light emitting device and the heat radiating member; and
   a bonding member fixing layer disposed in the cavity and covering a side surfaces of the bonding member and the light emitting device, wherein the bonding member fixing layer forms the bottom of the cavity.

2. The light emitting device package according to claim 1, wherein the heat radiating member is exposed to the inner portion of the cavity from the bonding member fixing layer.

3. The light emitting device package according to claim 1, wherein the heat radiating member is disposed on at least one of the plurality of layers.

4. The light emitting device package according to claim 1, each of the plural layers is made of a High Temperature Co-fired Ceramic (HTCC) material.

5. The light emitting device package according to claim 1, wherein the bonding member fixing layer is one of the plural layers.

6. The light emitting device package according to claim 1, further comprising a first connecting electrode and a second connecting electrode disposed on the bonding member fixing layer and opened toward an inner portion of the cavity from the bonding member fixing layer.

7. The light emitting device package according to claim 6, further comprising a wire electrically connecting the light emitting device to the first connecting electrode.

8. The light emitting device package according to claim 6, further comprising a Zener diode disposed on the second connecting electrode.

9. The light emitting device package according to claim 1, wherein the heat radiating member comprises at least one of copper-tungsten (Cu—W), copper (Cu), molybdenum (Mo), and tungsten (W).

10. The light emitting device package according to claim 1, wherein the bonding member fixing layer has an upper surface higher than an upper surface of the bonding member and lower than an upper surface of the light emitting device.

11. The light emitting device package according to claim 1, wherein the bonding member fixing layer has a roughness at an upper surface thereof.

12. The light emitting device package according to claim 1, further comprising a reflective material disposed between the light emitting device and the bonding member fixing layer, and between the bonding member and the bonding member fixing layer.

13. The light emitting device package according to claim 1, wherein the heat radiating member is exposed from a back surface of the package body.

14. The light emitting device package according to claim 7, further comprising a third connecting electrode disposed on one layer of the plurality of layers which is placed under the light emitting device and electrically connecting to the heat radiating member.

15. The light emitting device package according to claim 14, further comprising:
   a first electrode layer and a second electrode layer disposed under the package body;
   a first via contact passing through at least one of the plurality of layers and connecting the third connecting electrode to the first electrode layer; and
   a second via contact passing through at least one of the plurality of layers and connecting the first connecting electrode to the second electrode layer.

16. The light emitting device package according to claim 15, further comprising a dummy electrode disposed under the package body and spaced from the first electrode layer and the second electrode layer.

17. The light emitting device package according to claim 1, further comprising a resin layer disposed in the cavity and enclosing the light emitting device.

18. The light emitting device package according to claim 1, wherein the bonding member fixing layer is made of a material different from the plurality of layers.

19. The light emitting device package according to claim 1, wherein the light emitting device generates light having a wavelength of 260 nm to 395 nm.

20. A light emitting device package comprising:
   a package body having a cavity composed of a side surface and a bottom, wherein the package body has a structure in which a plurality of layers is laminated and the cavity is formed by the plurality of layers;
   a heat radiating member under the cavity of the package body;
   a light emitting device disposed on the heat radiating member;
   a bonding member disposed between the light emitting device and the heat radiating member; and
   a bonding member fixing layer disposed in the cavity and covering a side surfaces of the bonding member and the light emitting device, wherein a thickness of the bonding member fixing layer is greater than a thickness of the bonding member and smaller than a sum of the thickness of the bonding member and a height of the light emitting device.

21. A light emitting device package comprising:
   a package body having a cavity composed of a side surface and a bottom, wherein the package body has a structure in which a plurality of layers is laminated and the cavity is formed by the plurality of layers;
   a heat radiating member disposed under the cavity of the package body;
   a light emitting device disposed on the heat radiating member;
   a bonding member disposed between the light emitting device and the heat radiating member;
   a bonding member fixing layer disposed in the cavity and covering a side surfaces of the bonding member and the light emitting device;
   a connecting electrode disposed on one layer of the plurality of layers which is placed under the light emitting device and electrically connecting to the heat radiating member;
   an electrode layer disposed under the package body; and
   a via contact passing through at least one of the plurality of layers and connecting the connecting electrode to the electrode layer.

* * * * *